United States Patent
Schultz

(10) Patent No.: US 11,652,050 B2
(45) Date of Patent: May 16, 2023

(54) INSET POWER POST AND STRAP ARCHITECTURE WITH REDUCED VOLTAGE DROOP

(71) Applicant: ADVANCED MICRO DEVICES, INC., Santa Clara, CA (US)

(72) Inventor: Richard Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/135,122

(22) Filed: Dec. 28, 2020

(65) Prior Publication Data

US 2022/0208678 A1   Jun. 30, 2022

(51) Int. Cl.
| | | |
|---|---|---|
| *H01L 23/522* | (2006.01) | |
| *H01L 23/528* | (2006.01) | |
| *H01L 27/092* | (2006.01) | |
| *H01L 21/8238* | (2006.01) | |
| *H01L 21/285* | (2006.01) | |
| *H01L 29/45* | (2006.01) | |

(52) U.S. Cl.
CPC .... *H01L 23/5286* (2013.01); *H01L 21/28518* (2013.01); *H01L 21/823814* (2013.01); *H01L 21/823871* (2013.01); *H01L 23/5226* (2013.01); *H01L 27/092* (2013.01); *H01L 29/45* (2013.01)

(58) Field of Classification Search
CPC . H01L 23/522; H01L 23/528; H01L 23/5226; H01L 23/5286; H01L 29/45; H01L 27/092; H01L 21/285; H01L 21/238; H01L 21/28518; H01L 21/823814; H01L 21/823871; H01L 23/485; H01L 27/02; H01L 27/0207; H01L 27/118; H01L 2027/11875; H01L 2027/11881
USPC .......................................................... 257/369
See application file for complete search history.

(56) References Cited

U.S. PATENT DOCUMENTS

| | | | |
|---|---|---|---|
| 2007/0278528 A1* | 12/2007 | Ato | ...................... H01L 27/0207 257/207 |
| 2017/0154848 A1* | 6/2017 | Fan | ........................ H01L 27/088 |
| 2018/0090440 A1 | 3/2018 | Schultz et al. | |
| 2018/0314785 A1 | 11/2018 | Schultz | |
| 2018/0315709 A1 | 11/2018 | Schultz | |
| 2019/0155979 A1 | 5/2019 | Schultz | |
| 2021/0406439 A1* | 12/2021 | Schultz | ............... H01L 23/5286 |

* cited by examiner

*Primary Examiner* — Chuong A Luu

(57) ABSTRACT

A cell layout implemented in an integrated circuit (IC) includes a first plurality of independent power posts in a first metal layer. Each independent power post of the plurality of independent power posts provides a power connection to one device of a plurality of devices within the cell layout. A source or drain of each device of the plurality of devices is connected to one independent power post of the plurality of independent power posts. The IC further includes a plurality of independent power straps in a second metal layer that is different from the first metal layer. Each independent power strap of the plurality of independent power straps spans across and connects to multiple independent power posts of the first plurality of independent power posts.

16 Claims, 8 Drawing Sheets

INSET POWER POST AND STRAP ARCHITECTURE WITH REDUCED VOLTAGE DROOP

BACKGROUND

As semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electromigration (EM), leakage currents, and processing yield are some issues that affect the placement of devices and the routing of signals across an entire die of a semiconductor chip. Thus, these issues can delay the completion of the design and affect the time to market.

Manual full-custom designs are replaced with automation where possible to shorten the design cycle for semiconductor chips. A designer describes a functional unit or a complex gate in a high-level description language such as Verilog, Very High-Speed Integrated Circuit Hardware Description Language (VHDL), and so on. A synthesis tool receives the logic description and provides the logical netlist. The logical netlist is used by a place-and-route (PNR) tool to provide a physical layout. The place-and-route tool uses a cell layout library to provide the physical layout.

The cell layout library includes multiple standard cell layouts for providing the various functionalities used by the semiconductor chip. In some cases, a standard cell layout is created manually. Therefore, each new standard cell layout or each original standard cell layout being modified is created manually. In other cases, the rules used by the place-and-route tool are adjusted to automate cell creation. However, the automated process at times does not satisfy each of the rules directed at performance, power consumption, signal integrity, process yield, both local and external signal routing, including internal cross-coupled connections, height and width cell dimensions matching other cells, pin access, power rail design and so on. Therefore, designers manually create these cells to achieve better results for the multiple characteristics or rewrite the rules for the place-and-route tool.

Generally, standard cell layouts use at least one power rail for the supply voltage connections, referred to as the VDD power rail, and one power rail for the ground connections, referred to as the VSS power rail. In some cases, the power and ground rails use relatively long wires utilizing multiple metal layers such as horizontal Metal 0, vertical Metal 1, horizontal Metal 2, and vertical Metal 3 in addition to the corresponding vias. In other cases, fixed location posts are used within the standard cell to make the power and ground connections.

Before the power and ground connections are created, some layout cells in the layout cell library need to be expanded to create space for the connections and satisfy the multiple design rule checks (DRCs). Expanding the cell layouts increases the on-die area consumed by these cells. When a significant portion of the chip design uses these cells, the overall chip area significantly increases. Also, the power connection architecture of current standard cells may not sufficiently manage the significant voltage experienced by the devices as technology nodes continue to scale.

SUMMARY OF EMBODIMENTS

In accordance with one aspect, an integrated circuit (IC) implementing a cell layout includes a first plurality of independent power posts in a first metal layer. Each independent power post of the first plurality of independent power posts provides a power connection to one device of a plurality of devices within the cell layout. In at least some embodiments, each independent power post of the first plurality of independent power posts is placed at a three contact-poly-pitch or less. The power connection to the one device, in at least some embodiments, is one of a power supply connection and a ground connection. A source or drain of each device of the plurality of devices is connected to one independent power post of the first plurality of independent power posts. The IC further includes a plurality of independent power straps in a second metal layer that is different than the first metal layer. Each independent power strap of the plurality of independent power straps spans across and connecting to multiple independent power posts of the first plurality of independent power posts.

In at least some embodiments, a first independent power strap of the plurality of independent power straps is connected to a first set independent power posts of the plurality of independent power posts providing a power supply connection to a p-type device of the plurality of devices. A second independent power strap of the plurality of independent power straps is connected to a second set independent power posts of the plurality of independent power posts providing a ground connection to an n-type devices of the plurality of devices.

In at least some embodiments, the IC further includes one or more input and output pins extending from a top to a bottom of the cell layout, wherein a highest metal layer used for each of the one or more input and output pins is the first metal layer.

In at least some embodiments, the IC further includes a second plurality of independent power posts in a third metal layer different from the first metal layer and second metal layer. At least one of the independent power straps of the plurality of independent power straps, in at least some embodiments, connects multiple independent power posts of the second plurality of independent power posts to multiple independent power posts of the first plurality of independent power posts. Each independent power strap of the plurality of independent power straps, in at least some embodiments, is routed no further than between the first plurality of independent power posts and the second plurality of independent power posts. In at least some embodiments, the first metal layer is a vertical Metal one layer, the second metal layer is a horizontal Metal two layer and the third metal layer is a vertical Metal three layer.

In accordance with another aspect, an integrated circuit (IC) implementing a cell layout includes a plurality of transistors, a plurality of trench silicide contacts, a plurality of full trench silicide straps, and a first plurality of independent power posts in a first metal layer. Each trench silicide contact of the plurality of trench silicide contacts is formed as a source region or a drain region of a respective transistor of the plurality of transistors. Each full trench silicide straps of the plurality of full trench silicide straps is a trench silicide contact formed as a drain region of two separate transistors of the plurality of transistors. Each independent power post of the first plurality of independent power posts provides a power connection to at least one transistor of the plurality of transistors. In at least some embodiments, each independent power post of the first plurality of independent power posts is placed at a three contact-poly-pitch or less. Each trench silicide contact of the plurality of trench silicide contacts is connected to one of the independent power posts of the plurality of independent power posts.

In at least some embodiments, the IC further includes one or more input and output pins extending from a top to a bottom of the cell layout, wherein a highest metal layer used for each of the one or more input and output pins is the first metal layer.

In at least some embodiments, the IC further includes a plurality of independent power straps in a second metal layer different from the first metal layer. Each independent power strap of the plurality of independent power straps spans across and is connected to multiple independent power posts of the first plurality of independent power posts. A first independent power strap of the plurality of independent power straps, in at least some embodiments, is connected to a first set independent power posts of the plurality of independent power posts providing a power supply connection to a p-type transistors of the plurality of transistors. A second independent power strap of the plurality of independent power straps, in at least some embodiments, is connected to a second set independent power posts of the plurality of independent power posts providing a ground connection to an n-type transistors of the plurality of transistors.

In at least some embodiments, the IC further includes a second plurality of independent power posts in a third metal layer different from the first metal layer and second metal layer. At least one of the independent power straps of the plurality of independent power straps connects multiple independent power posts of the second plurality of independent power posts to multiple independent power posts of the first plurality of independent power posts.

In accordance with another aspect, a method of fabricating an integrated circuit (IC) includes forming a plurality of trench silicide contacts, a plurality of full trench silicide straps, a first plurality of independent power posts in a first metal layer. Each trench silicide contact of the plurality of trench silicide contacts is formed as a source region or a drain region of a respective transistor of a plurality of transistors. Each full trench silicide strap of the plurality of full trench silicide straps is a trench silicide contact formed as a drain region of two separate transistors of the plurality of transistors. Each independent power post of the first plurality of independent power posts provides a power connection to at least one transistor of the plurality of transistors. The method further includes connecting each trench silicide contact of the plurality of trench silicide contacts to one of the independent power posts of the plurality of independent power posts.

In at least some embodiments, connecting each independent power strap of the plurality of independent power straps includes connecting a first independent power strap of the plurality of independent power straps to a first set independent power posts of the plurality of independent power posts providing a power supply connection to p-type transistors of the plurality of transistors, and connecting a second independent power strap of the plurality of independent power straps to a second set independent power posts of the plurality of independent power posts providing a ground connection to n-type transistors of the plurality of transistors.

In at least some embodiments, the method further includes forming a second plurality of independent power posts in a third metal layer different from the first metal layer and second metal layer, and connecting multiple independent power posts of the second plurality of independent power posts to multiple independent power posts of the first plurality of independent power posts using at least one independent power posts of the second plurality of independent power posts.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

Figure 1:
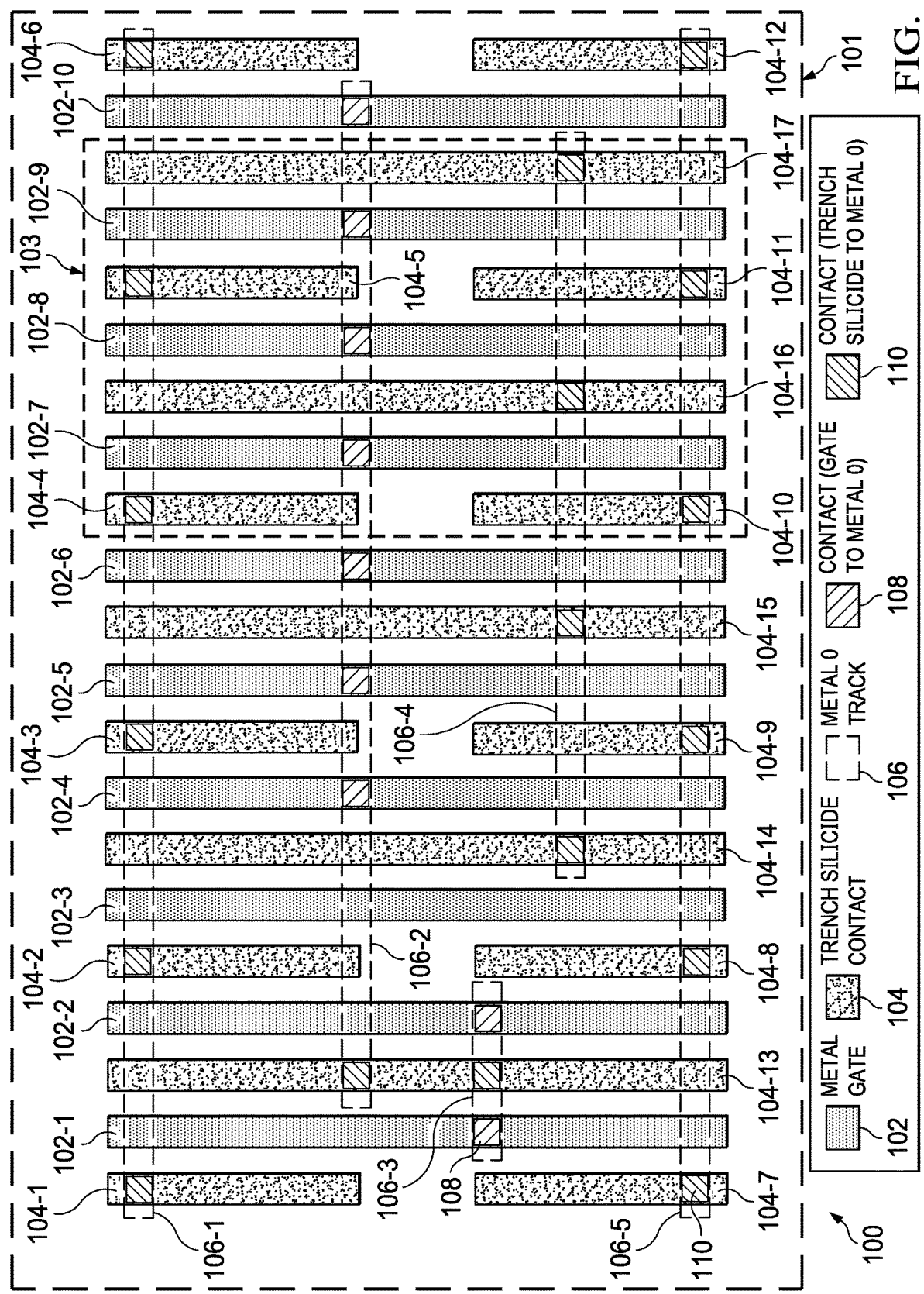
FIG. 1 is a diagram of a top view of an integrated circuit implementing a standard cell layout comprising a first metal layer for a complex logic gate in accordance with some embodiments.

As scaling progresses towards 2 nanometer (nm) technology nodes and beyond, conventional standard cell architectures become increasingly problematic with respect to voltage droop (IR drop) and cell placement. For example, a rapid increase in 1× Metal and 1× Via resistance occurs at 2 nm and beyond, which leads to significant voltage droop at the chip level. Conventional standard cell architectures generally cannot reduce the voltage droop to an acceptable level due to, for example, routing congestion, implementation of shared power rails, and so on.

In a shared power rail configuration, adjacent rows of cells share a supply voltage (VDD) power rail and a ground (GND or VSS) power rail. The pitch between Metal 1 power posts of the shared power rails is typically too large for sufficiently reducing the voltage droop, and decreasing the pitch negatively affects cell placement. For example, the Metal 1 power posts of the shared power rails can interfere or collide with fixed Metal 1 pins of conventional standard cells, especially at an 8 contact-poly-pitch (CPP) or less. As such, conventional standard cells are typically spread out or expanded to avoid collisions with the Metal 1 power posts, thereby preventing cells from being placed at high utilization. Expanding the cell layouts also increases the on-die area consumed by these cells. When a significant portion of the chip design uses these cells, the overall chip area significantly increases. In some instances, dual height cells can be used to help overcome cell placement issues. Also, the use of buried power rails has been proposed, but through-silicon-vias (TSVs) are typically required every 1 micron to obtain acceptable voltage droop levels. Adding TSVs at this pitch may not be practical due to manufacturing challenges and potential issues with the input-output signal pins on the other side of the die.

The present disclosure describes embodiments of systems and methods for overcoming voltage droop and cell placement issues experienced by standard cell architectures at 2 nm technology nodes and beyond. As described in greater detail below, a standard cell implements an inset power post configuration. This configuration situates multiple independent power posts in a first metal layer (e.g., Metal 1), each providing a power connection to a device (transistor) within the standard cell. In at least some embodiments, the independent power posts are situated every 3 CPP or less, with each independent power post being coupled to an underlying second metal layer (e.g., Metal 0) by a separate via. In at least some embodiments, each independent power post is coupled to an overlaying third metal layer (e.g., Metal 2) by another via. The third metal layer, in at least some embodiments, comprises a first continuous and uninterrupted power strap used to provide supply voltage (VDD) power connections to a first set of the independent power posts. A second continuous and uninterrupted power strap is used to provide ground (GND or VSS) power connections to a second set of the independent power posts.

Since the power posts are independent and inset in the first metal layer, no power rails are used in the first metal layer and the use of outboard shared power rails is avoided. Therefore, the inset power posts can be placed every 3 CPP or less without cell placement restrictions since there are no Metal 1 power posts of a shared power rail to collide with. Also, for dual height cells comprising stacked cells, the third metal layer power straps provide additional connection points for metal posts in a fourth metal layer (e.g., Metal 3). The additional connection points allow the metal posts in the fourth metal layer to connect the third metal layer power strap of one cell to the third metal layer power strap of another cell. By adding additional power posts and vias inside the standard cell architecture and keeping the power posts at a single height configuration, the Thevenin resistance and overall voltage droop can be reduced to achieve acceptable voltage drop targets for 2 nm technology nodes and beyond. The inset power post configuration overcomes standard cell placement restrictions due to blockages of metal one and Metal two layers and avoids pitch defined fixed location power/ground vertical posts and horizontal straps.

Figure 2:
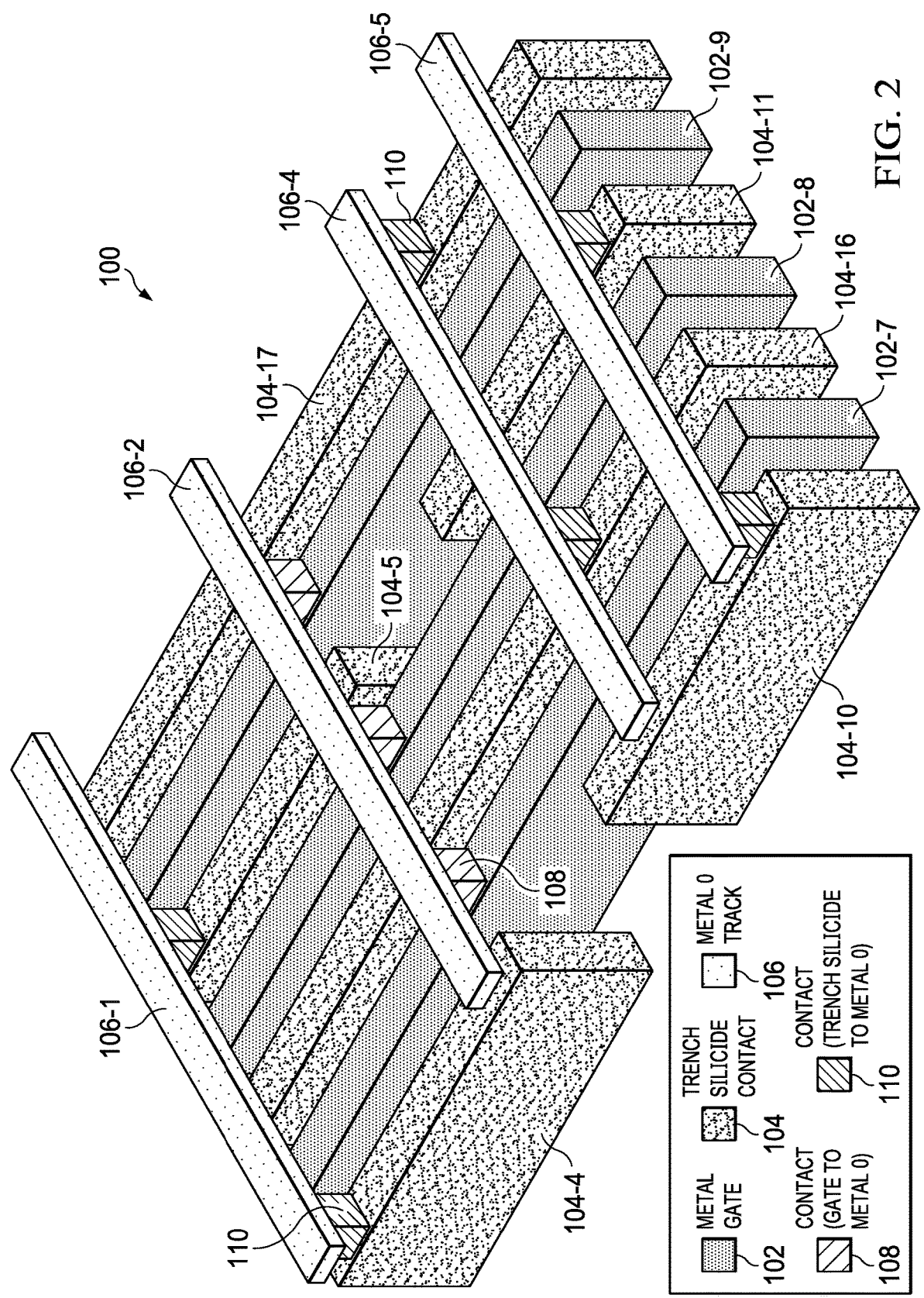
FIG. 2 is a diagram of an isometric view of a portion of the standard cell layout of FIG. 1 in accordance with some embodiments.

Referring to FIG. 1, a generalized block diagram of a top view of an integrated circuit 101 implementing a standard cell layout 100 is shown. FIG. 2 shows a corresponding isometric view of portion 103 of cell layout 100 outlined in FIG. 1. Here, the active regions are not shown in cell layout 100 for ease of illustration. In this example, p-type metal-oxide-semiconductor field-effect-transistors, also referred to as pFETs, are illustrated at the top of cell layout 100. N-type metal-oxide-semiconductor FETs, also referred to as nFETs, are illustrated at the bottom of cell layout 100. In the illustrated example, cell layout 100 is for a logic gate, such as a buffer/inverter. However, the layout techniques shown in FIG. 1 to FIG. 7 can be used for various other standard cells, such as those used for other complex gates and functional units.

In at least some embodiments, the devices in cell layout 100 are fabricated by one of the extreme ultraviolet lithography (EUV) technique, directed self-assembly (DSA) lithography technique, immersion lithography techniques, or the double patterning technique. The EUV technique, in at least some embodiments, provides more flexibility for via and contact modules relative to other techniques. The EUV technique uses an extreme ultraviolet wavelength to reach a resolution below 30 nanometers. The extreme ultraviolet wavelength is approximately 13.5 nanometers. Relatively high temperature and high-density plasma are used to provide the EUV beam. The DSA technique takes advantage of the self-assembling properties of materials to reach nanoscale dimensions. Immersion lithography uses a liquid medium, such as purified water, between the lens of the imaging equipment and the wafer surface. Previously, the gap space was simply air. The resolution achieved by this technique is the resolution of the imaging equipment increased by the refractive index of the liquid medium. In some examples, the increased resolution falls above 80 nanometers.

The double patterning uses immersion lithography systems to define features with a resolution between 40 and 80 nanometers. Either of the self-aligned doubled patterning (SADP) technique or the litho-etch-litho-etch (LELE) technique is used. The double patterning technique counteracts the effects of diffraction in optical lithography, which occurs when the minimum dimensions of features on a wafer are less than the 193-nanometer wavelength of the illuminating light source. Other examples of techniques used to counteract the effects of diffraction in optical lithography are phase-shift masks, optical-proximity correction (OPC) techniques, optical equipment improvements, and computational lithography.

When selecting between the EUV, DSA, immersion lithography, or double patterning, and other techniques, cost is considered since the cost increases from immersion lithography to EUV. However, over time, the costs of these techniques adjust, and additional and newer techniques are developed for providing relatively high resolution for the width and the pitch of device features. Accordingly, one of a variety of lithography techniques is used to provide relatively high resolution for the width and the pitch.

In at least some embodiments, the devices (transistors) in cell layout 100 are non-planar devices (transistors). Non-planar transistors are a recent development in semiconductor processing for reducing short channel effects. Tri-gate transistors, FinFETs, vertical transport FETs, and gate all around (GAA) transistors are examples of non-planar transistors. As shown, cell layout 100 comprises metal gates 102 (illustrated as 102-1 to 102-10) and trench silicide contacts 104 (illustrated as 104-1 to 104-17) in a vertical direction. The trench silicide contacts 104, in at least some embodiments, are used for source/drain regions and as local interconnects in the vertical direction. In the horizontal direction, cell layout 100 comprises a first set of horizontal metal tracks 106 (illustrated as 106-1 to 106-5), a first set of contacts 108, and a second set of contacts 110. The horizontal metal tracks 106 are situated within a first metal layer and used for local interconnections. The first set of contacts 108 connects the metal gate 102 to a metal track 106 in the first metal layer. The second set of contacts 110 connect the trench silicide contact 104 to a horizontal metal track 106 in the first metal layer. In at least some embodiments, the first metal layer is the bottom metal layer in the integrated circuit (e.g., the first metal layer above the active layer). As such, the first metal layer may be referred to as the Metal 0 layer or M0 layer, and each of the first set of horizontal metal tracks 106 may be referred to as a Metal 0 track/line 106 or an M0 track/line 106.

Each of the Metal 0 tracks 106, in at least some embodiments, can connect to a trench silicide contact 104 without any bends in its routing. Spacing can exist between Metal 0 tracks 106 of the pFET devices and the Metal 0 tracks 106 of the nFET devices for additional signal routing tracks. In at least some embodiments, the relatively high resolution for the width and the pitch of the Metal 0 tracks 106 provides multiple locations where contacts can be placed on the metal gate 102 and trench silicide contacts 104 for efficient signal and power routing. The flexibility offered by these potential contact locations eliminates using other Metal interconnects, such as Metal 1 tracks or Metal 2 tracks, and the corresponding contacts for routing signals and power.

In at least some embodiments, one or more of the trench silicide contacts 104 are separate and physically disconnected trench silicide contacts. For example, trench silicide contacts 104-1 to 104-6 are formed from the top of cell layout 100 and stop near the midpoint of cell layout 100. Therefore, there is an interruption in the physical formation of the trench silicide contacts 104-1 to 104-6 going from the top to the bottom of cell layout 100. A corresponding trench silicide contact 104-7 to 104-12 is formed from within the same column close to the midpoint of cell layout 100 and ending at the bottom of cell layout 100. Therefore, there is a physical interruption, or a physical break, between the trench silicide contact 104-1 to 104-6 at the top of the cell cell layout 100 and the trench silicide contact 104-7 to 104-12 at the bottom of the cell layout within the same column. Each of the separate trench silicide contact 104-1 to 104-12 forms either a source region or a drain region of a respective transistor in cell layout 100. A contact and an additional metal layer are used to connect the source or drain region to another node, such as a region of another transistor.

Other trench silicide contacts 104 are full trench silicide straps 104-13 to 104-17 that are used for local interconnections. The full trench silicide straps 104-13 to 104-17 are trench silicide contacts formed in a physically uninterrupted manner from the top of cell layout 100, where the pFETs are located, to the bottom of cell layout 100, where the nFETs are located. There are no breaks in the full trench silicide straps 104-13 to 104-17 from the top to the bottom of cell layout 100. In other words, the full trench silicide straps 104-13 to 104-17 are single conductive layers that are physically uninterrupted by another conductive layer as they traverse at least two different active regions.

Each of the full trench silicide straps 104-13 to 104-17, in at least some embodiments, is a trench silicide contact formed as a drain region of two separate transistors in cell layout 100. In one example, the first transistor of the two transistors is the pFET at the top of cell layout 100, and the second transistor of the two transistors is the nFET at the bottom of cell layout 100. These two transistors use the same full trench silicide strap 104-13 to 104-17 for routing the drain terminal connections in place of using two separate and disconnected trench silicide contacts 104-1 to 14-12, a contact, and an additional metal layer.

In at least some embodiments, the full trench silicide straps 104-13 to 104-17 are used as a single node shared by a pFET and an nFET. The single node may be an intermediate output node within the standard cell where the value of the output node is used within the standard cell but not used outside of the standard cell. In at least some embodiments, implementing full trench silicide straps 104-13 to 104-17 removes any further connections beyond the trench silicide to electrically connect the drain regions of the pFET transistor and the nFET transistor. For example, in at least some embodiments, one or more of the single shared nodes using a respective one of the full trench silicide straps 104-13 to 104-17 are achieved without using contacts 108 and Metal 0 tracks 106 and, therefore, eliminate using Metal 2 tracks in later cell connections.

One or more of the full trench silicide straps 104-13 to 104-17 may form unidirectional signal routes between a pFET and nFET. A unidirectional signal route, for example, is a signal route with no bends. In contrast, signal routes with bends, such as L-shapes and other angles for the routes, are referred to as bidirectional routes. Bidirectional routes create a significant on-die area penalty and reduce the number of tracks used for routing signals. In one example, self-aligned double patterned (SADP) breaks are created for the bidirectional signal routes. The created separation, which is referred to as an SADP break, causes an appreciable area penalty. In contrast, the unidirectional full trench silicide straps 104-13 to 104-17 provide efficient cell signal routing. In at least some embodiments, a self-aligned gate and local interconnect process in addition to a gate open contact process is used to create the full trench silicide straps 104-13 to 104-17.

Figure 3:
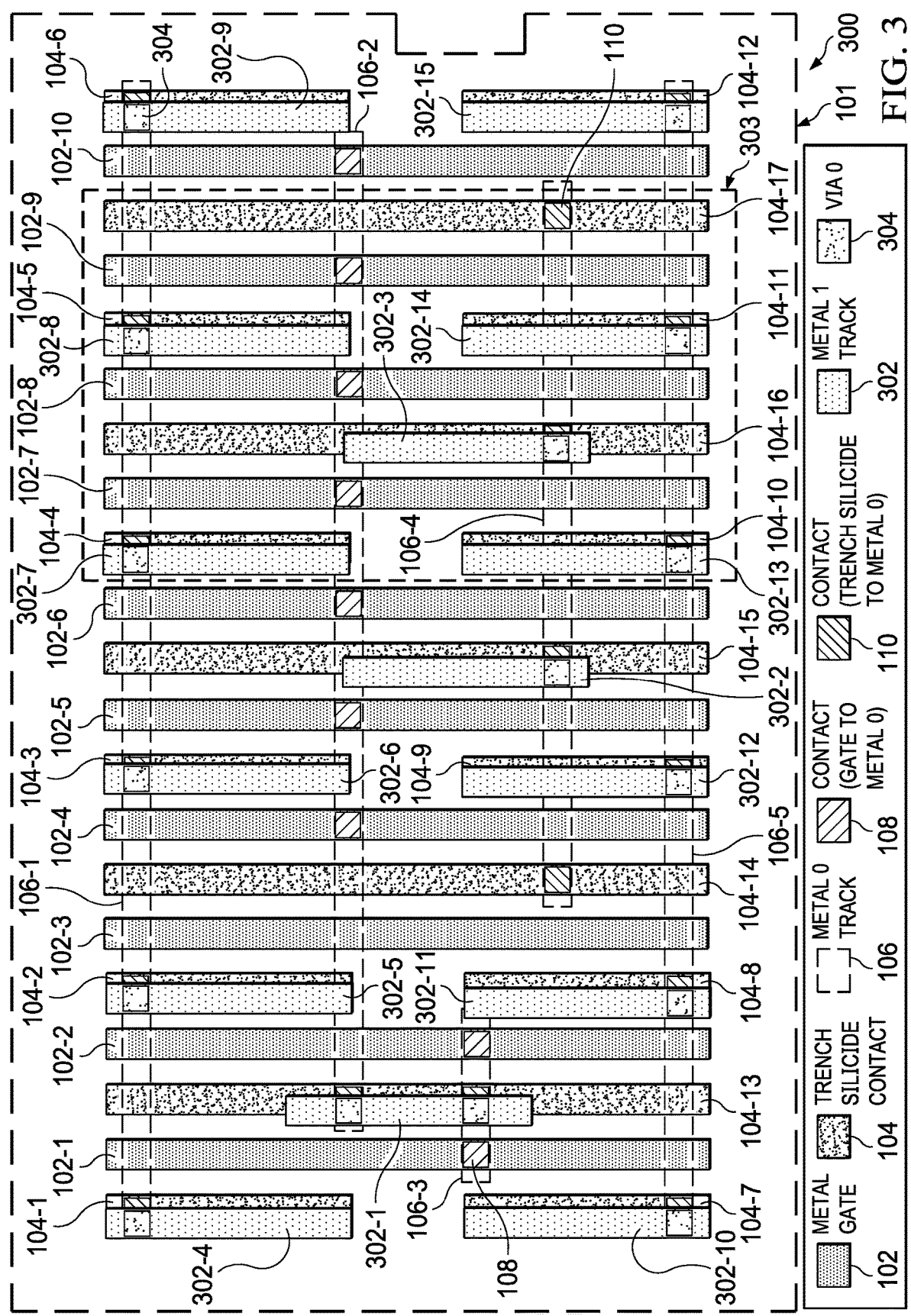
FIG. 3 is a diagram of a top view of the standard cell layout of FIG. 1 after power posts have been added in a second metal layer for the complex logic gate in accordance with some embodiments.
Figure 4:
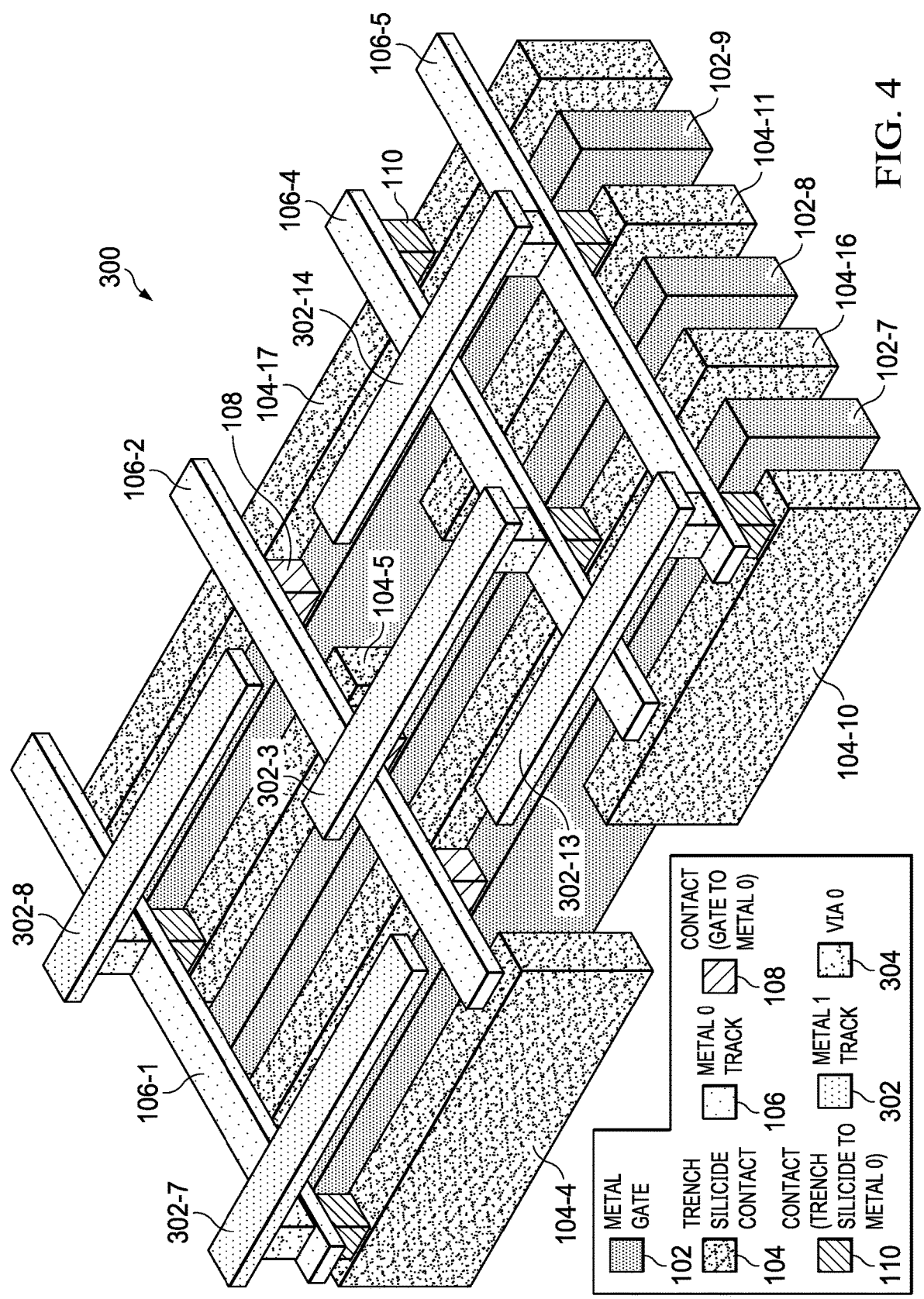
FIG. 4 is a diagram of an isometric view of a portion of the standard cell layout of FIG. 3 in accordance with some embodiments.

FIG. 3 shows a generalized block diagram of another top view of a standard cell layout 300, and FIG. 4 shows a corresponding isometric view of portion 303 of cell layout 100 outlined in FIG. 3. Layout elements previously described with respect to FIGS. 1 and 2 are numbered identically. Here, cell layout 300 is the same as cell layout 100 shown in FIGS. 1 and 2, but cell layout 300 includes an additional metal layer and vias. For example, cell layout 300 comprises a first set of vertical metal tracks 302 (illustrated as 302-1 to 302-15) in a second metal layer. In at least some embodiments, the vertical metal tracks 302 are used for local interconnections in the vertical direction. A first set of vias 304 is used to connect the Metal 0 tracks 106 to the vertical metal tracks 302. It should be understood the vertical metal tracks 302 and vias 304 are shown as being off-centered from the trench silicide contacts 104 for ease of illustration.

In the illustrated example, the second metal layer is the next layer above the Meal 0 layer. As such, the second metal layer may be referred to as the Metal 1 layer or M1 layer, and each of the second set of metal tracks 302 may be referred to as a Metal 1 track/line 302 or an M1 track/line 302. Also, a via between a landing metal layer $Mt_x$ (e.g., Metal 0 layer) and the covering metal layer $Mt_{x+1}$ (e.g., Metal 1 layer) is typically referred to as a $V_x$ via. Therefore, each of the first set of vias 304 may be referred to as a V0 via 304 or Via 0 304. In at least some embodiments, the Metal 0 tracks 106 and the Metal 1 tracks 302 are unidirectional layers since there are no bends or L-shapes in the signal routes. For example, the Metal 0 tracks 106 remain horizontal and do not bend toward a vertical direction. Similarly, the vertical Metal 1 tracks 302 remain vertical and do not bend toward a horizontal direction.

FIG. 3 and FIG. 4 together illustrate that, in at least some embodiments, one or more of the Metal 1 tracks 302 are configured as input/output pins 302-1 to 302-3 inside cell layout 100. For example, each of the one or more input/output pins 302-1 to 302-3 are coupled to a trench silicide contact 104 by V0 via 304. In at least some embodiments, the one or more input/output pins 302-1 to 302-3 are placed such that the input/output pins 302-1 to 302-3 are extended from the top to the bottom of cell layout 100. In one example, a highest metal layer used for the input/output pins 302-1 to 302-3 is the Metal 1 layer. Also, the input/output pins 302-1 to 302-3 can be unidirectional routes in the Metal 1 layer.

In at least some embodiments, one or more of the Metal 1 tracks 302 are configured as Metal 1 power posts 302-4 to 302-15 inside cell layout 100. For example, at the top of cell layout 300, Metal 1 power posts 302-4 to 302-9 are each situated above and connected to a trench silicide contact 104-1 to 104-6, which acts as source/drain for a respective pFET, by a V0 via 304. At the bottom of cell layout 300, Metal 1 power posts 302-10 to 302-15 are each situated above and connected to a trench silicide contact 104-7 to 104-12, which acts as source/drain for a respective nFET, by a V0 via 304. In this example, the Metal power posts 302-4 to 302-9 situated at the top of the layout are supply voltage (VDD) power posts/pins, and the Metal 1 power posts 302-10 to 302-15 situated at the bottom of cell layout 300 are ground (VSS) power posts/pins. Each of Metal 1 power posts 302-10 to 302-15, in at least some embodiments, is an independent power post that does not connect to another power post in the Metal 1 layer and provides a power connection to a device (transistor) within the standard cell. Since the power posts are independent, no end-to-end power rails are used in the standard cell.

In at least some embodiments, the Metal 1 power posts 302-4 to 302-15 are placed at 2CPP with each source/drain in cell layout 300 being connected to one of the Metal 1 power post 302-4 to 302-15 by a V0 via 304, as shown in FIG. 3 and FIG. 4. In some instances, placing Metal 1 power posts 302-4 to 302-15 at 2CPP may not be possible, such as when devices are stacked. In these instances, the Metal 1 power posts 302-4 to 302-15 may be placed at greater than 2CPP (e.g., 3CPP), but each source/drain in the cell layout is still connected to a Metal 1 power posts 302-4 to 302-15 by a V0 via 304. Also, because the Metal 1 power post locations for power and ground connections are not fixed at the chip level, the Metal 1 power locations can be moved inside cell layout 300. As such, outboard shared power rails and their associated cell placement restrictions are avoided.

Figure 5:
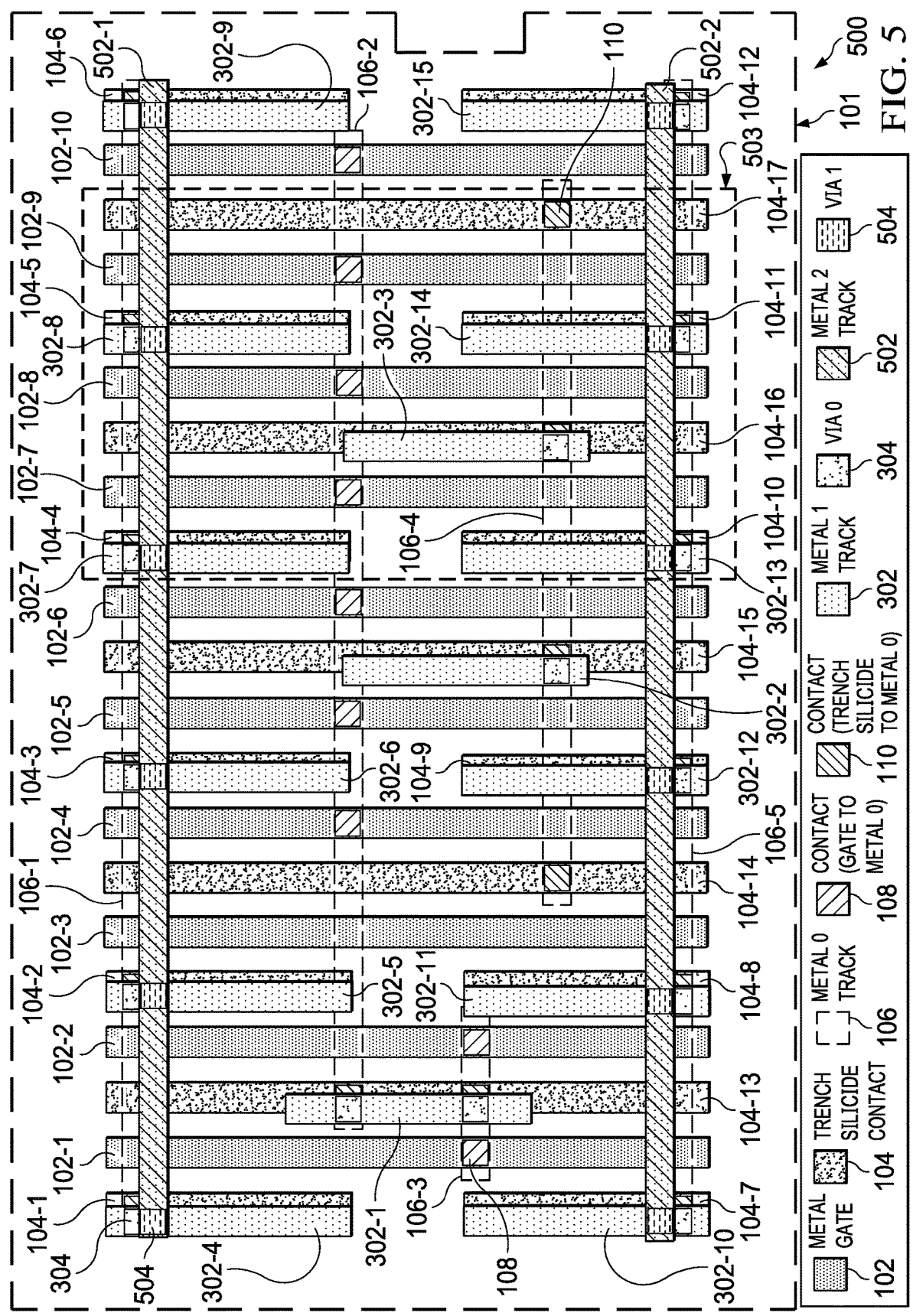
FIG. 5 is a diagram of a top view of the standard cell layout of FIG. 3 after power straps have has been added in a third metal layer for the complex logic gate in accordance with some embodiments.
Figure 6:
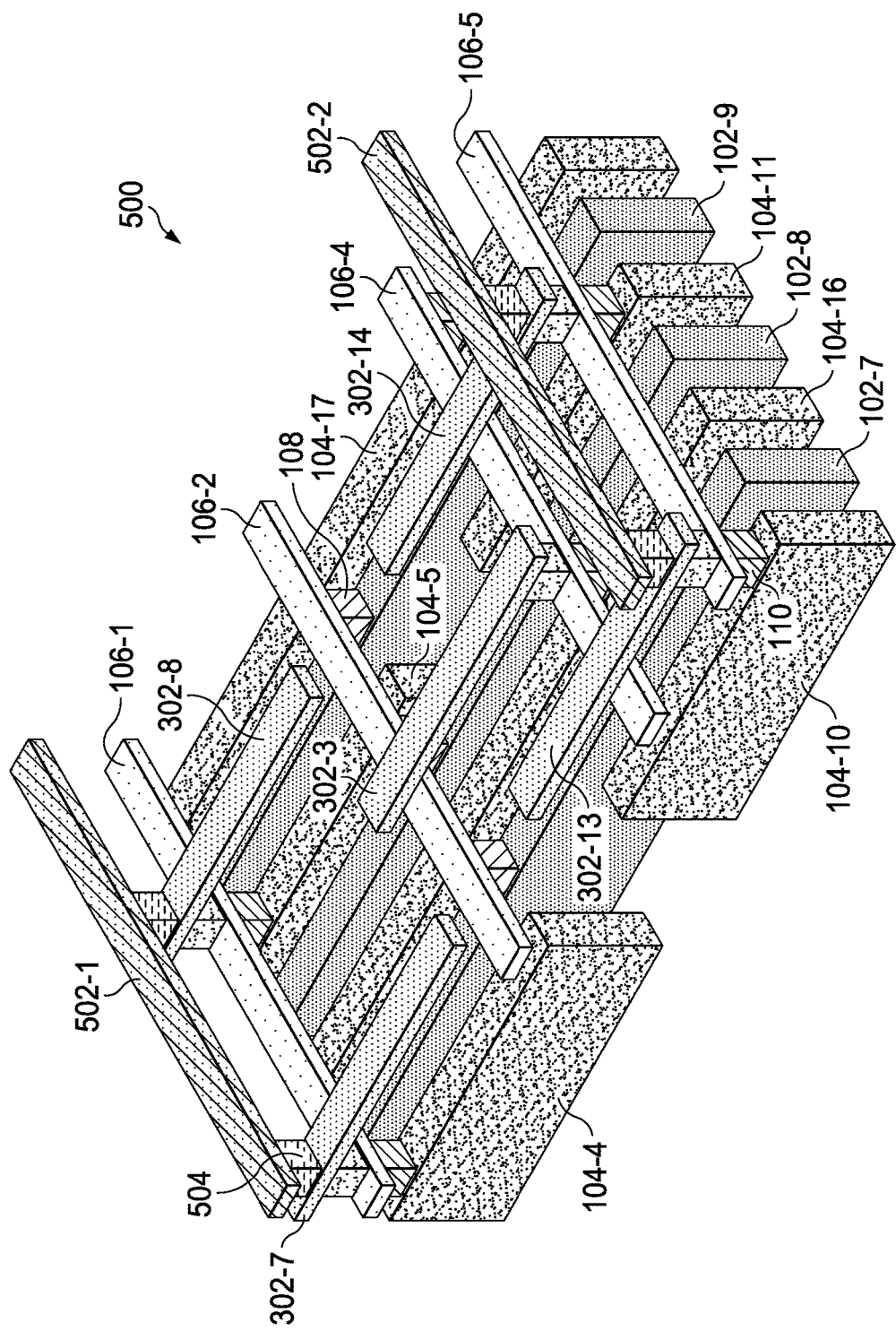
FIG. 6 is a diagram of an isometric view of a portion of the standard cell layout of FIG. 5 in accordance with some embodiments.

FIG. 5 shows a generalized block diagram of another top view of a standard cell layout 500, and FIG. 6 shows a corresponding isometric view of portion 503 of cell layout 100 outlined in FIG. 5. Layout elements previously described with respect to FIG. 1 to FIG. 4 are numbered identically. Here, cell layout 500 is the same as cell layout 300 shown in FIGS. 3 and 4, but cell layout 500 includes an additional metal layer and vias. For example, cell layout 500 comprises a second set of horizontal metal tracks 502 (illustrated as 502-1 and 502-2) in a third metal layer. In at least some embodiments, the horizontal metal tracks 502 are used for local interconnections in the horizontal direction. A second set of vias 504 is used to connect the Metal 1 power posts 302-4 to 302-15 to the horizontal metal tracks 502. In this example, the third metal layer is situated above the second metal layer. As such, each of the second set of horizontal metal tracks 502 may be referred to as a Metal 2 track/line 502 or an M2 track/line 502, and each of the second set of vias 504 may be referred to as a V1 via 504 or Via 1 504.

The Metal 2 tracks 502, in at least some embodiments, are configured as Metal 2 power straps 502 for connecting the Metal 1 power posts 302-4 to 302-15 to the power grid. In some examples, the Metal 2 power straps 502 are continuous and uninterrupted by another conductive layer. Each Metal 2 power strap 502 may be an independent power strap that is not connected to another power strap in the Metal 2 layer. As such, power rails are not used in the Metal 2 layer. The Metal 1 power post 302-4 to 302-15 and Metal 2 strap 502 configurations, as shown in FIG. 5 and FIG. 6, allow for more efficient power delivery to the devices of the standard cell and provides additional pathways for current to flow, thereby overcoming voltage droop issues at 2 nm technology nodes and beyond.

In the illustrated example, a first Metal 2 power strap 502-1 is situated at the top of cell layout 500 and is connected to each of the pFET Metal 1 power posts 302-4 to 302-9 by a V0 via 504. In this example, the first Metal 2 power strap 502-1 connects each of the pFET Metal 1 power posts 302-4 to 302-9 to the supply voltage (VDD) portion of the power grid. A second Metal 2 power strap 502-2 is situated at the bottom of cell layout 500 and is connected to each of the nFET Metal 1 power posts 302-10 to 302-15 by a V0 via 504. In this example, the second Metal 2 power strap 502-2 connects each of the nFET Metal 1 power posts 302-10 to 302-15 to the ground (GND or VSS) portion of the power grid. Connections to power and ground are routed from the Metal 2 power straps 502 to the V1 vias 504 to the Metal 1 power posts 302-4 to 302-15 to the V0 vias 304 to the Metal 0 tracks 106 to the contacts 108 to the trench silicide contacts 104, which are within a corresponding standard cell.

Figure 7:
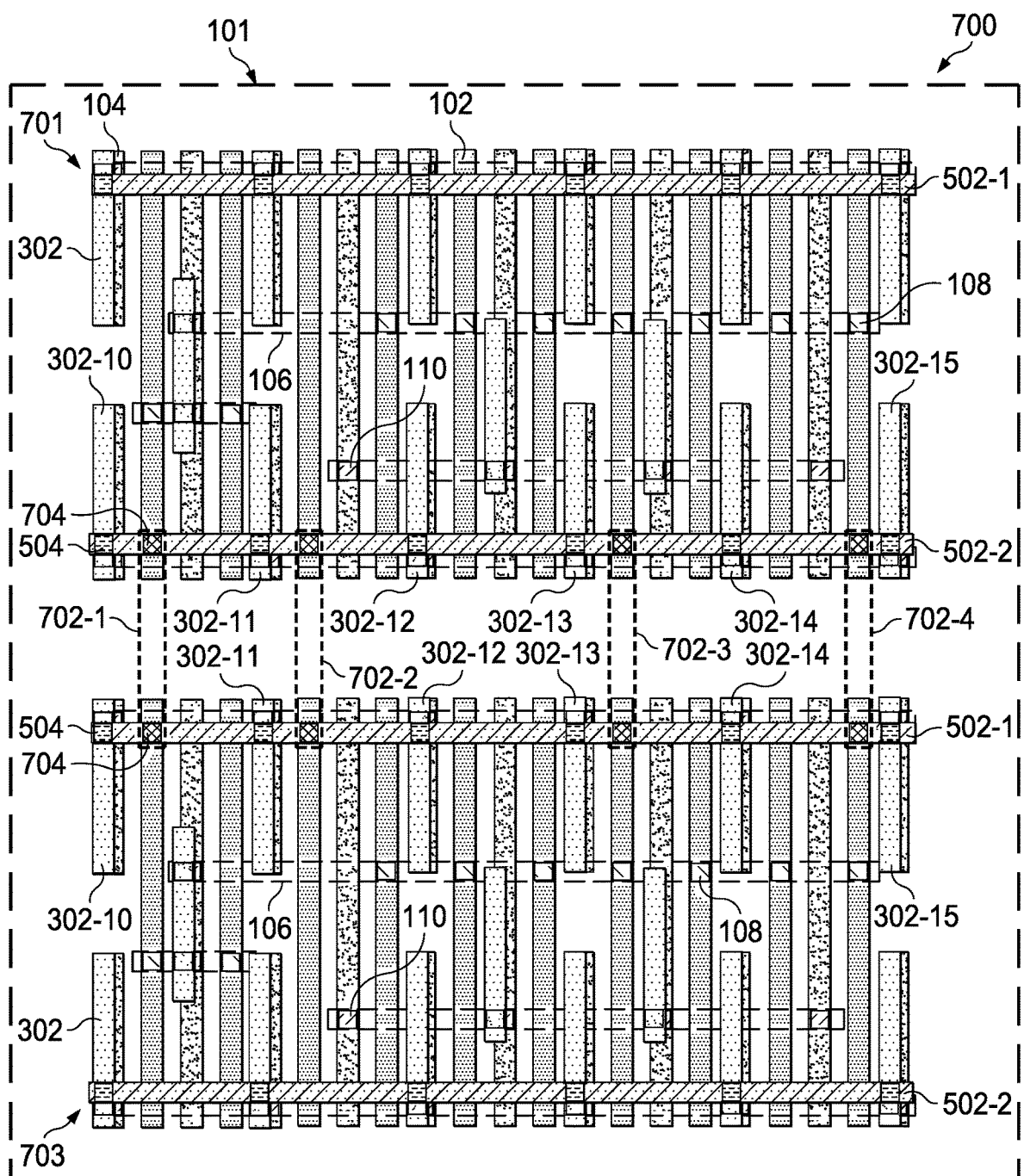
FIG. 7 is a diagram of a top view of a dual height cell layout for a complex logic gate in which corresponding power straps of two standard cells are connected in a fourth metal layer in accordance with some embodiments.

As described above, the Metal 2 power straps 502 span across multiple Metal 1 power posts 302-4 to 302-15. This configuration of the Metal 2 power straps 502 allows additional metal posts to be added in a fourth metal layer prior to or after routing. For example, FIG. 7 shows a generalized block diagram of another top view of a standard cell layout 700. Layout elements previously described with respect to FIG. 1 to FIG. 6 are numbered identically. Here, cell layout 700 is a dual height cell layout comprising a first standard cell 701 stacked above a second standard cell 703. The standard cells 701 and 703 are based on cell layout 500 of FIG. 5. The second standard cell 703 is the same as the first standard cell 701 but has been flipped or mirrored.

Cell layout 700, in at least some embodiments, comprises a second set of vertical metal tracks 702 (illustrated as 702-1 to 702-4) in a fourth metal layer. In at least some embodiments, the vertical metal tracks 702 are used for local interconnections in the vertical direction. A third set of vias 704 is used to connect the Metal 2 power straps 502 to the vertical metal tracks 702. In this example, the fourth metal layer is situated above the third metal layer. As such, each of the second set of vertical metal tracks 702 may be referred to as a Metal 3 track/line 702 or an M3 track/line 704, and each of the third set of vias 704 may be referred to as a V2 via 704 or Via 2 704.

Figure 8:
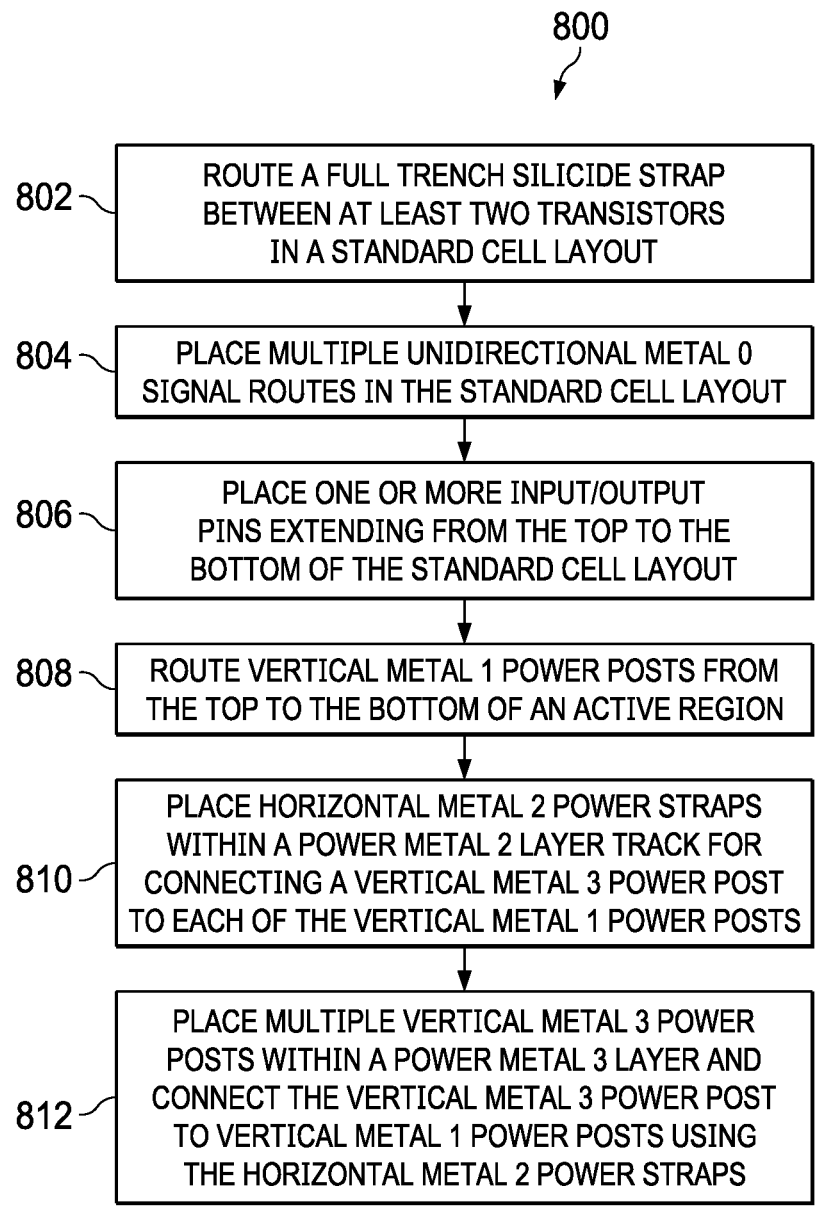
FIG. 8 is a flow diagram illustrating an example method for fabricating an integrated circuit implementing a cell layout that overcomes voltage droop issues in 2 nanometer technology nodes and beyond in accordance with some embodiments.

In at least some embodiments, the Metal 3 tracks 702 are configured as power posts. For example, FIG. 7 shows that a plurality of Metal 3 power posts 702-1 to 702-4 connect a Metal 2 power strap 502-2 of the first standard cell 701 to a Metal 2 power strap 502-2 of the second standard cell 703. In this example, the Metal 2 power straps 502-2 connected by the Metal 3 power posts 702-1 to 702-4 are the ground (GND or VSS) Metal 2 straps 502. Each Metal 1 power post 302-10 to 302-15 providing a ground connection is routed to any of the Metal 3 layer power posts 702 by the Metal 2 power straps 502. The power (VDD) Metal 2 straps 502-1 of the first and second standard cells 701 and 703 can be similarly connected by the Metal 3 power posts 702-1 to 702-4. In at least some embodiments, the Metal 3 power posts 702-1 to 702-4 are independent and are not connected to other power posts in the Metal 3 layer. Since the Metal 2 power straps 502 span across multiple Metal 1 power posts 302-4 to 302-15, additional Metal 3 power posts 702 can be added within cell layout 700 instead of implementing Metal 2 posts. The additional Metal 3 power posts 702 allow for more efficient power delivery to the dual height cell devices and provides additional pathways for current to flow, thereby overcoming voltage droop issues at 2 nm technology nodes and beyond. Also, the relatively short lengths of the power posts and power straps throughout the Metal 1, Metal 2, and Metal 3 provides Blech length relief for these metal layers and better electromigration (EM) tolerance/margin FIG. 8 illustrates, in flow chart form, one example method 800 of fabricating an integrated circuit (IC) implementing a cell layout that overcomes voltage droop issues in 2 nm technology nodes and beyond. The techniques described for FIG. 8 have been previously discussed in detail with respect to FIG. 1 to FIG. 7. A full trench silicide strap, at block 802, is routed between at least two transistors in a standard cell layout. As described earlier, the full trench silicide strap is a single, uninterrupted, trench silicide contact formed as a drain region of at least two separate transistors. In other words, the full trench silicide strap is a single conductive layer that is physically uninterrupted by another conductive layer as the strap traverses at least two different active regions. In at least some embodiments, the at least two separate transistors are a pFET in a p-type active region and an nFET in an n-type active region. The full trench silicide strap, in at least some embodiments, is used as an intermediate output node within the standard cell layout. By not using any other conductive layer for the route, routing congestion is reduced within the standard cell layout. In one example, the full trench silicide strap is a unidirectional strap since there are no bends in the routing of the full trench silicide strap. In at least some embodiments, a self-aligned gate and local interconnect process in addition to a gate open contact process is used to create the full trench silicide strap.

Multiple unidirectional Metal 0 signal routes, at block 804, are placed in the standard cell layout. Each of the Metal 0 signal routes is connected to a respective one of multiple trench silicide contacts. In at least some embodiments, techniques such as EUV, DSA, immersion lithography, or double patterning are used to provide the resolution of each of the width and the pitch of the unidirectional Metal 0 signal routes. One or more input/output pins, at block 806, are placed such that the input/output pins are extended from the top to the bottom of the standard cell layout. In at least some embodiments, a highest metal layer used for the input/output pins is the Metal 1 layer. The input/output pins, in at least some embodiments, are unidirectional routes in the Metal 1 layer.

Vertical Metal 1 power posts used for a power connection or a ground connection, at block 808, are routed from a top to a bottom of an active region, permitting multiple locations to be used for connections to a horizontal Metal 2 power strap. The vertical Metal 1 power posts are used instead of outboard shared power rails. In at least some embodiments, each source/drain of a device within the standard cell layout is connected to one of the vertical Metal 1 power posts. The vertical Metal 1 power posts, in at least one embodiment, are independent power posts that do not connect to another power post in the Metal 1 layer. Horizontal Metal 2 power straps, at block 810, are placed within a power Metal 2 layer track for connecting a vertical Metal 3 power post to each of the vertical Metal 1 power posts. In at least some embodiments, a first horizontal Metal 2 power strap spans across and is connected to the vertical Metal 1 power posts placed for ground connections, and a second horizontal Metal 2 power strap spans across and is connected to the vertical Metal 1 power posts placed for power connections. The horizontal Metal 2 power straps, in at least some embodiments, are not connected.

Multiple vertical Metal 3 power posts, at block 812, are placed within a power Metal 3 layer and are not connected. The first horizontal Metal 2 power strap connects a first set of the vertical Metal 3 power posts to a first set of the Metal 1 power posts, and the second horizontal Metal 2 power strap connects a second set of the vertical Metal 3 power posts to a second set of the Metal 1 power posts. In embodiments implementing a dual height cell, vertical Metal 3 power posts are connected to vertical M1 power posts of a first cell by a horizontal Metal 2 power strap of the first and vertical M1 power posts of a second cell by a horizontal Metal 2 power strap of the second cell, as shown in FIG. 7.

In some embodiments, the standard cell layouts and techniques described above are implemented in a system including one or more integrated circuit (IC) devices (also referred to as integrated circuit packages or microchips). Electronic design automation (EDA) and computer-aided design (CAD) software tools may be used in the design and of the standard cells and the design and fabrication of IC devices implementing the standard cells. These design tools typically are represented as one or more software programs. The one or more software programs include code executable by a computer system to manipulate the computer system to operate on code representative of circuitry of one or more IC devices to perform at least a portion of a process to design or adapt a manufacturing system to fabricate the circuitry. This code can include instructions, data, or a combination of instructions and data. The software instructions representing a design tool or fabrication tool typically are stored in a computer-readable storage medium accessible to the computing system. Likewise, the code representative of one or more phases of the design or fabrication of an IC device may be stored in and accessed from the same computer-readable storage medium or a different computer-readable storage medium.

A computer-readable storage medium may include any non-transitory storage medium or combination of non-transitory storage media, accessible by a computer system during use to provide instructions and/or data to the computer system. Such storage media can include, but is not limited to, optical media (e.g., compact disc (CD), digital versatile disc (DVD), Blu-ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer-readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer-readable storage medium. The software can include the instructions and certain data that, when executed by the one or more processors, manipulate the one or more processors to perform one or more aspects of the techniques described above. The non-transitory computer-readable storage medium can include, for example, a magnetic or optical disk storage device, solid-state storage devices such as Flash memory, a cache, random access memory (RAM), or other non-volatile memory device or devices, and the like. The executable instructions stored on the non-transitory computer-readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified, and all such variations are considered within the scope of the disclosed subject matter. Accordingly, the protection sought herein is as set forth in the claims below.

What is claimed is:

1. An integrated circuit (IC) implementing a cell layout comprising:
   a first plurality of independent power posts in a first metal layer, each independent power post of the first plurality of independent power posts providing a power connection to one device of a plurality of devices within the cell layout, wherein a source or drain of each device of the plurality of devices is connected to one independent power post of the first plurality of independent power posts; and
   a plurality of independent power straps in a second metal layer different from and situated over the first metal layer, each independent power strap of the plurality of independent power straps spanning across and connecting to multiple independent power posts of the first plurality of independent power posts.

2. The integrated circuit of claim 1, wherein the power connection to the one device is one of a power supply connection and a ground connection.

3. The integrated circuit of claim 1, wherein each independent power post of the first plurality of independent power posts is placed at a three contact-poly-pitch or less.

4. The integrated circuit of claim 1, wherein:
   a first independent power strap of the plurality of independent power straps is connected to a first set of independent power posts of the plurality of independent power posts providing a power supply connection to a p-type device of the plurality of devices; and
   a second independent power strap of the plurality of independent power straps is connected to a second set of independent power posts of the plurality of independent power posts providing a ground connection to an n-type devices of the plurality of devices.

5. The integrated circuit of claim 1, further comprising:
   one or more input and output pins extending from a top to a bottom of the cell layout, wherein a highest metal layer used for each of the one or more input and output pins is the first metal layer.

6. The integrated circuit of claim 5, further comprising:
   a second plurality of independent power posts in a third metal layer different from the first metal layer and second metal layer.

7. The integrated circuit of claim 6, wherein at least one of the independent power straps of the plurality of independent power straps connects multiple independent power posts of the second plurality of independent power posts to multiple independent power posts of the first plurality of independent power posts.

8. The integrated circuit of claim 6, wherein each independent power strap of the plurality of independent power straps is routed no further than between the first plurality of independent power posts and the second plurality of independent power posts.

9. The integrated circuit as recited in claim 6, wherein the first metal layer is a vertical Metal one layer, the second metal layer is a horizontal Metal two layer and the third metal layer is a vertical Metal three layer.

10. An integrated circuit (IC) implementing a cell layout comprising:
    a plurality of transistors;
    a plurality of trench silicide contacts, wherein each trench silicide contact of the plurality of trench silicide contacts is formed as a source region or a drain region of a respective transistor of the plurality of transistors;
    a plurality of full trench silicide straps, wherein each full trench silicide straps of the plurality of full trench silicide straps is a trench silicide contact formed as a drain region of two separate transistors of the plurality of transistors; and
    a first plurality of independent power posts in a first metal layer situated over the plurality of trench silicide contacts and the plurality of full trench silicide straps, wherein each independent power post of the first plurality of independent power posts provides a power connection to at least one transistor of the plurality of transistors, and
    wherein each trench silicide contact of the plurality of trench silicide contacts is connected to one of the independent power posts of the plurality of independent power posts.

11. The integrated circuit of claim 10, wherein each independent power post of the first plurality of independent power posts is placed at a three contact-poly-pitch or less.

12. The integrated circuit of claim 10, further comprising:
    one or more input and output pins extending from a top to a bottom of the cell layout, wherein a highest metal layer used for each of the one or more input and output pins is the first metal layer.

13. The integrated circuit of claim 10, further comprising:
a plurality of independent power straps in a second metal layer different from the first metal layer, wherein each independent power strap of the plurality of independent power straps spans across and is connected to multiple independent power posts of the first plurality of independent power posts.

14. The integrated circuit of claim 13, wherein:
a first independent power strap of the plurality of independent power straps is connected to a first set of independent power posts of the plurality of independent power posts providing a power supply connection to a p-type transistors of the plurality of transistors; and
a second independent power strap of the plurality of independent power straps is connected to a second set of independent power posts of the plurality of independent power posts providing a ground connection to an n-type transistors of the plurality of transistors.

15. The integrated circuit of claim 13, further comprising:
a second plurality of independent power posts in a third metal layer different from the first metal layer and second metal layer.

16. The integrated circuit of claim 15, wherein at least one of the independent power straps of the plurality of independent power straps connects multiple independent power posts of the second plurality of independent power posts to multiple independent power posts of the first plurality of independent power posts.

* * * * *

UNITED STATES PATENT AND TRADEMARK OFFICE
CERTIFICATE OF CORRECTION

PATENT NO. : 11,652,050 B2
APPLICATION NO. : 17/135122
DATED : May 16, 2023
INVENTOR(S) : Richard Schultz Page 1 of 1

It is certified that error appears in the above-identified patent and that said Letters Patent is hereby corrected as shown below:

In the Claims

Column 14 Line 11, Claim 4 "n-type devices of the" should be --n-type device of the--

Column 14 Line 46, Claim 10 "trench silicide straps of the plurality" should be --trench silicide strap of the plurality--

Column 15 Line 13, Claim 14 "p-type transistors of the" should be --p-type transistor of the--

Column 15 Line 18, Claim 14 "n-type transistors of the plurality" should be --n-type transistor of the plurality--

Signed and Sealed this
Eighteenth Day of July, 2023

Katherine Kelly Vidal
*Director of the United States Patent and Trademark Office*